United States Patent [19]

Buchberger

[11] 4,112,384
[45] Sep. 5, 1978

[54] CONTROLLED RECOVERY AUTOMATIC GAIN CONTROL AMPLIFIER

[75] Inventor: Gregory D. Buchberger, Mount Prospect, Ill.

[73] Assignee: Morgan Industries, Chicago, Ill.

[21] Appl. No.: 800,003

[22] Filed: May 24, 1977

[51] Int. Cl.² ............................................. H03G 3/20
[52] U.S. Cl. ................................ 330/141; 179/1 VC; 330/135; 330/281; 330/284
[58] Field of Search ............. 179/1 VC; 325/411, 410; 330/135, 141, 281, 284, 145

[56] References Cited
FOREIGN PATENT DOCUMENTS 1,094,357 12/1967 United Kingdom ............. 179/1 VC X Primary Examiner—Lawrence J. Dahl
Attorney, Agent, or Firm—Hume, Clement, Brinks, Willian & Olds, Ltd.

[57] ABSTRACT

An automatic gain control amplifier having a controlled recovery of gain is disclosed and includes a peak detector for generating an output when the amplifier output exceeds a predetermined level, a memory setting circuit responsive to the peak detector output, a memory controlled by the memory setting circuit, and a memory adjust circuit responsive to information derived from the amplifier output. The output of the memory controls an attenuator of the automatic gain control amplifier. Amplifier output level change detection circuitry is also disclosed and accepts the output of the amplifier for producing an output indicating amplifier output level changes exceeding a predetermined magnitude. The level change detection output controls the memory adjust circuit.

27 Claims, 4 Drawing Figures

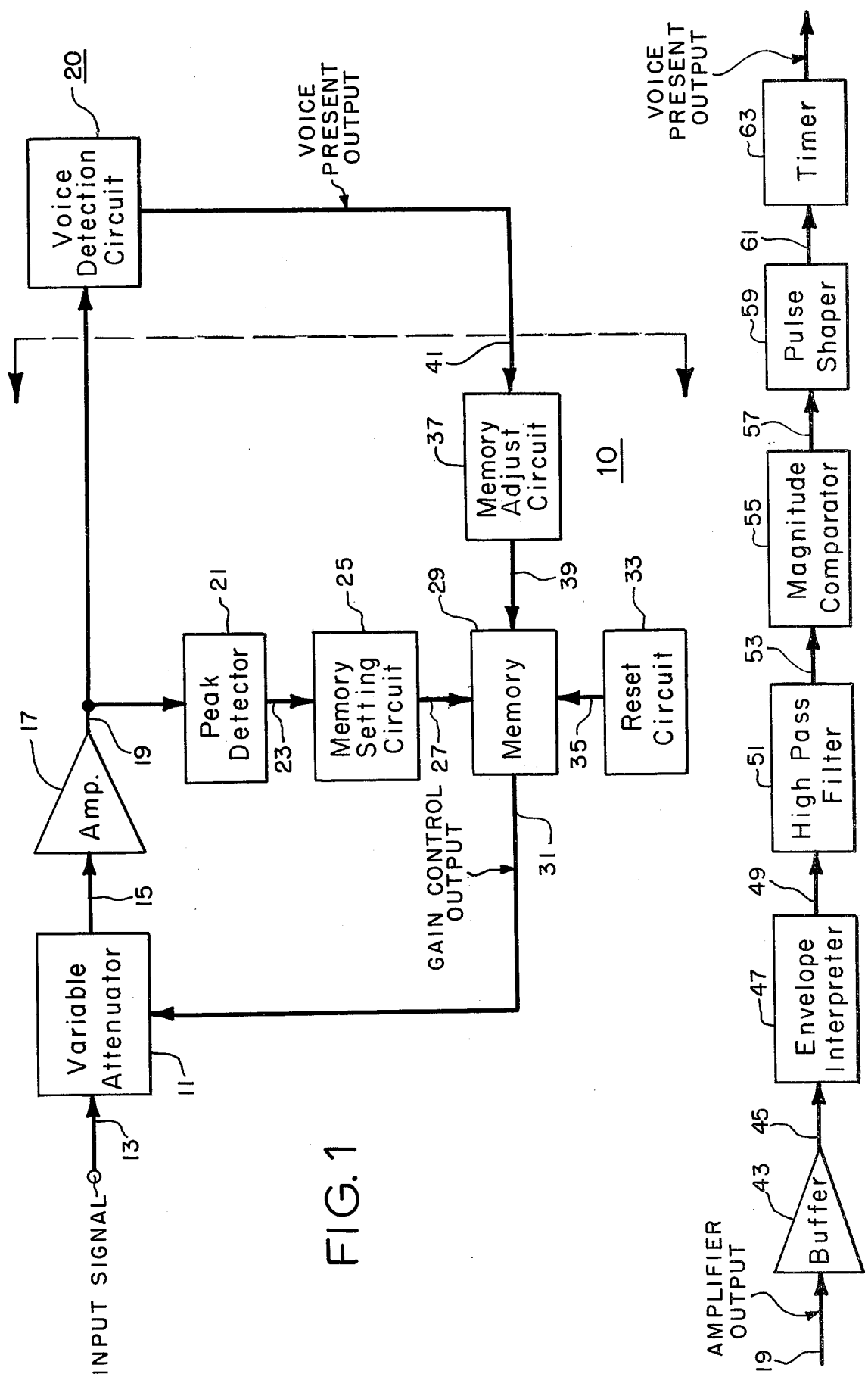

CONTROLLED RECOVERY AUTOMATIC GAIN CONTROL AMPLIFIER

BACKGROUND OF THE INVENTION

The disclosed invention relates to an automatic gain control amplifier which is particularly advantageous for use with voice detection systems.

Voice detection systems are generally utilized in situations where the presence or absence of speech is used to initiate a defined procedure. For example, a voice detection system can be used in a phone answering system to control the recording of the incoming call when speech is detected or the playback of a recorded message when a predetermined pause in speech is detected.

Amplifiers having automatic gain control are generally used in such systems for providing a reasonably constant amplifier output which is representative of the sound input to the voice detection system. The amplifier output is analyzed to determine whether speech is present at the input to the system.

However, prior art automatic gain control amplifiers have made voice detection systems susceptible to producing erroneous speech-present outputs caused by background noise present at the source of the voice signals. Such erroneous detection is generally caused by the tendency of prior art automatic gain control amplifiers to increase in gain during time periods when no speech is being inputted to the system. When the gain increases sufficiently, background noise appears as the nominal input to the system which causes an amplifier output level comparable to the output when speech is actually present.

It is therefore an object of the invention to provide an improved automatic gain control amplifier in which gain control is not affected by input levels below a predetermined threshold.

Another object of the invention is to provide an improved automatic gain control amplifier in which gain is increased when the amplifier output is below a fixed threshold and above a controlled variable reference.

Still another object of the invention is to provide an improved automatic gain control which is useful in voice detection systems and allows automatic gain control only when speech is detected.

Another object of the invention is to provide an improved automatic gain control amplifier for use in voice detection systems which is not susceptible to an increase in gain when the input level is reduced to a level below that representative of speech.

A further object of the invention is to provide an improved automatic gain control for use in a voice detection system and wherein gain recovery rate is controlled by the speech input to the voice detection system.

SUMMARY OF THE INVENTION

The foregoing and other objects are accomplished by providing an attenuator having its attenuation controlled by the output of a memory, and wherein the attenuation is a function of the memory output level. The output level of the memory is determined by the output level of an amplifier which accepts the attenuator output. The output level of the memory tends to change in a first direction when the amplifier output exceeds a threshold level, thereby causing a decrease in gain. Depending upon the application of the disclosed automatic gain control amplifier, the memory output can be selectively changed in a second direction by the appropriate actuation of a memory adjust circuit coupled to the memory, thereby allowing a controllable increase in gain. In the disclosed automatic gain control amplifier, a selectively operable reset circuit is also disclosed and operates to set the memory to provide a memory output which allows the amplifier to achieve a maximum selected gain.

BRIEF DESCRIPTION OF THE DRAWINGS

The above-mentioned and other objects, advantages and features of the disclosed automatic gain control amplifier will be readily understood from the following detailed description when read in conjunction with the drawings wherein:

FIG. 1 is a schematic representation of the disclosed automatic gain control amplifier; and FIG. 2 is a schematic representation of a voice detection circuit with which the disclosed automatic gain control amplifier may be used.

DETAILED DESCRIPTION OF THE DISCLOSURE

Figure 3:
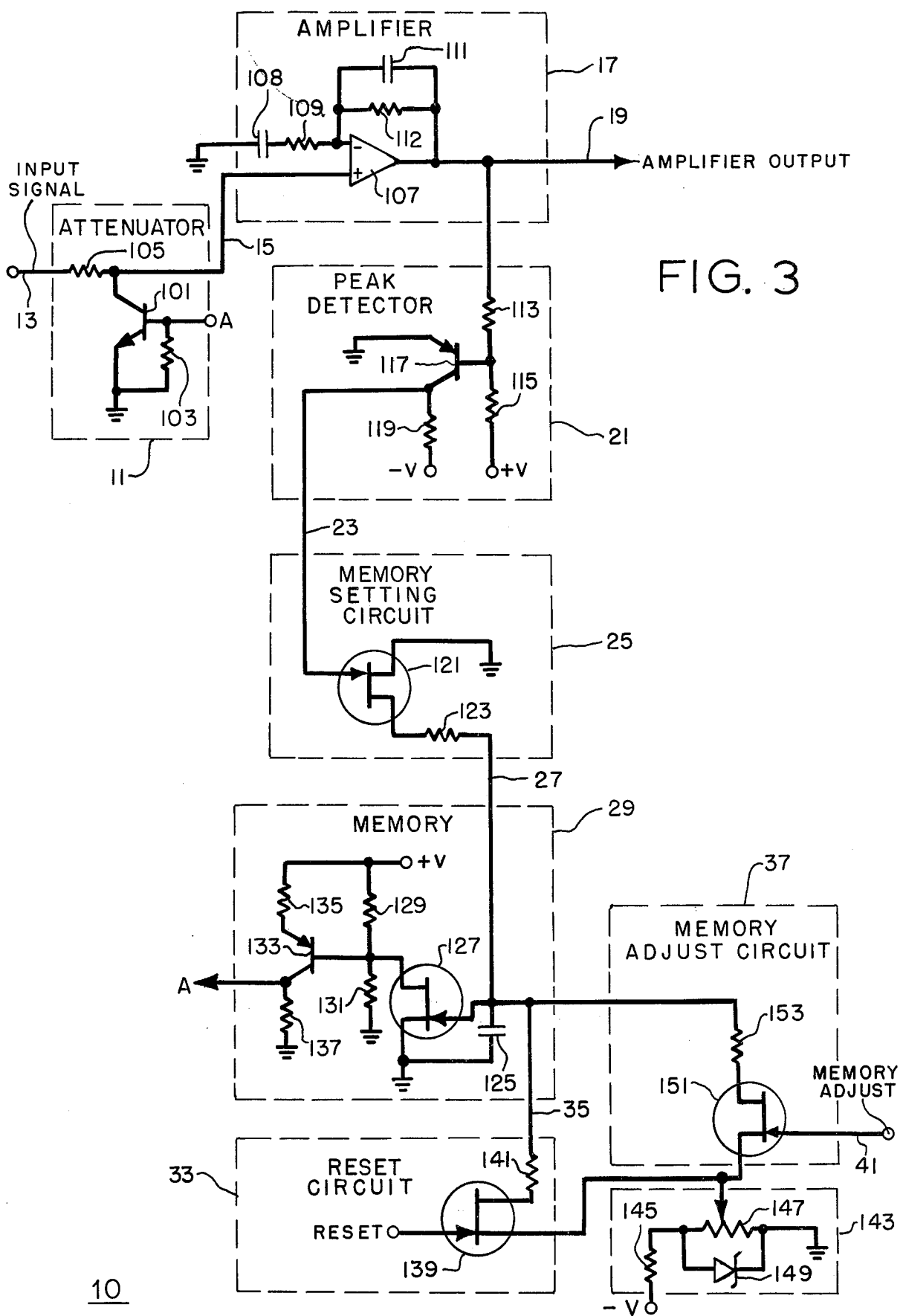
FIG. 3 is a detailed circuit diagram of the automatic gain control amplifier embodied in analog form.

FIG. 1 is a schematic representation of the disclosed controlled recovery automatic gain control amplifier 10 shown as it can be used with voice detection circuit 20. Although the automatic gain control amplifier 10 will be described in the context of voice detection systems, it will be evident to one skilled in the art that the features of the disclosed automatic gain control amplifier can be used for other systems in which gain control is important. Specific structure which may be used in the schematic of FIG. 1 are disclosed in FIGS. 3 and 4 which will be described in detail further below.

The automatic gain control amplifier includes a variable attenuator 11 which accepts an electrical input signal with voice representative components through an input line 13. The attenuation of the variable attenuator is controllable as will be discussed further below. The output of the variable attenuator is applied via an attenuated output line 15 to an amplifier 17. The amplifier 17 generates an amplified output signal which is present at an amplifier output line 19.

An increase in attenuation is controlled by circuitry including a peak detector 21 which senses the amplified output signal present at the amplifier output line 19. During any time intervals in which the amplified signal at the amplifier output line 19 exceeds a predetermined threshold, the peak detector 21 generates a detection switching signal at a detector output line 23. A memory setting circuit 25 is coupled to the detector output line 23 and generates a memory setting signal on a memory setting line 27 in response to the presence of a detection switching signal. The memory setting line is coupled to memory 29 which produces a gain control signal on a gain control line 31. The memory 29 responds to the memory setting signal on the memory setting line 27 by providing an appropriate output which controls the gain control signal present on the gain control line 31.

The gain control line 31 is fed back to the variable attenuator 11 which responds to the gain control signal with a variation in attenuation which is a function of the gain control signal.

From the foregoing it is readily understood that the peak detector 21, the memory setting circuit 25 and the memory 29 cooperate to reduce the level of the amplified output signal present on the amplifier output line 19 to a level just below the predetermined threshold established by the peak detector 21. As long as the amplified output signal remains just below the threshold level established by the peak detector 21, the memory setting circuit 25 reamins inoperative and the gain control output of the analog memory 29 does not change. Therefore, during such a condition, the attenuation of the variable attenuator 11 does not increase.

A reset circuit 33 is provided for establishing the gain control output of the memory in a condition which will provide a predetermined low level of attenuation, thereby allowing maximum gain. The reset circuit 33 is coupled via a reset line 35 to the memory 29.

Increasing the gain of the combination of the variable attenuator 11 and the amplifier 17 is controlled by apparatus which uses or senses the amplified output signal available on the amplifier output line 19. The apparatus utilizing or sensing the output signal would determine when an increase in gain is required and would apply an appropriate actuating signal to a memory adjusting circuit 37. The memory adjusting circuit 37 is a selectively actuable circuit coupled to the memory 29 via a memory control line 39 and functions to change the gain control output of the memory 29 in response to an actuation signal applied to a memory adjust actuation line 41 in such a manner that an appropriate memory output will be produced for reducing the attenuation of the attenuator 11 as a function of the output of the memory adjusting circuit 37. The memory adjust circuit 37 preferrably changes the gain control output of the memory 29 at a slow rate when it is activated.

FIG. 2 is a schematic diagram of a voice detection system with which the above disclosed automatic gain control amplifier 10 can be used.

The voice detection system 20 includes a buffer 43 which is coupled to the amplifier output line 19 and accepts the amplified output signal from the amplifier 17. The output of the buffer 43 is applied via bufer output line 45 to an envelope interpreter 47. The envelope interpreter 47 generates an envelope signal on envelope output line 49, which envelope signal corresponds to the amplitude of the waveform applied to the envelope interpreter 47 averaged over a short interval of time such as, for example, one-tenth of a second.

Thus, the envelope interpreter removes minor variations such as circuit noise from the waveform to be analyzed by the voice detection circuit 20 and thereby smooths the waveform while maintaining the shape of the waveform. The envelope signal of envelope output line 49 is applied to a high pass filter 51 which generates an output on filter output line 53. The output of the high pass filter 51 is indicative of the changes of large magnitude which take place over a reasonably short period of time and is indicative of the magnitude of such changes.

The high pass filter output is applied to a magnitude comparator 55 via the filter output line 53. The magnitude comparator 55 functions to determine when the amplitude of the filter output exceeds predetermined threshold levels. Specifically, the positive amplitude is compared with a positive threshold level and the negative amplitude is compared with a negative threshold level. The threshold levels are set at values which are determined to represent the minimum positive and negative amplitudes indicative of the presence of speech.

When either of the threshold levels of the magnitude comparator 55 is exceeded, a digital comparator output is generated on a comparator output line 57 which is coupled to a pulse shaper 59.

The comparator output causes the pulse shaper 59 to generate a limited duration pulse on a shaper output line 61. A timer 63 is responsive to the limited duration pulses and generates a voice present output pulse for a preset time interval in response to the most recent limited duration pulse on shaper output line 61. The voice present output of the timer 63 can be coupled to the memory discharge circuit 37 of the automatic gain amplifier 10 shown in FIG. 1 via the memory adjust actuation line 41.

From the foregoing it becomes clear that the voice detection circuit 20 controls the gain control output of the memory 29 in such a manner that the gain control output causes a decrease in the attenuation of the attenuator 11 when the presence of voice is detected. This reduction in the attenuation of the variable attenuator 11 increases the gain of the combination of the attenuator 11 and the amplifier 17.

Thus, the automatic gain control amplifier 10 increases its gain only upon specific control from apparatus which uses the amplified output on output line 19. In the foregoing example using the voice detection circuit 20, the gain of the automatic gain control amplifier 10 can be increased only when the presence of voice is detected. This prevents an increase in gain when no voice is present, which in a prior art voice detection systems would result in background noise becoming the nominal input signal at input line 13. While the voice detection circuit 20 selectively controls the increase in gain, the peak detector 21 and the memory charging circuit 25 cooperate to selectively decrease gain when the output of the amplifier 17 exceeds a predetermined threshold.

Figure 4:
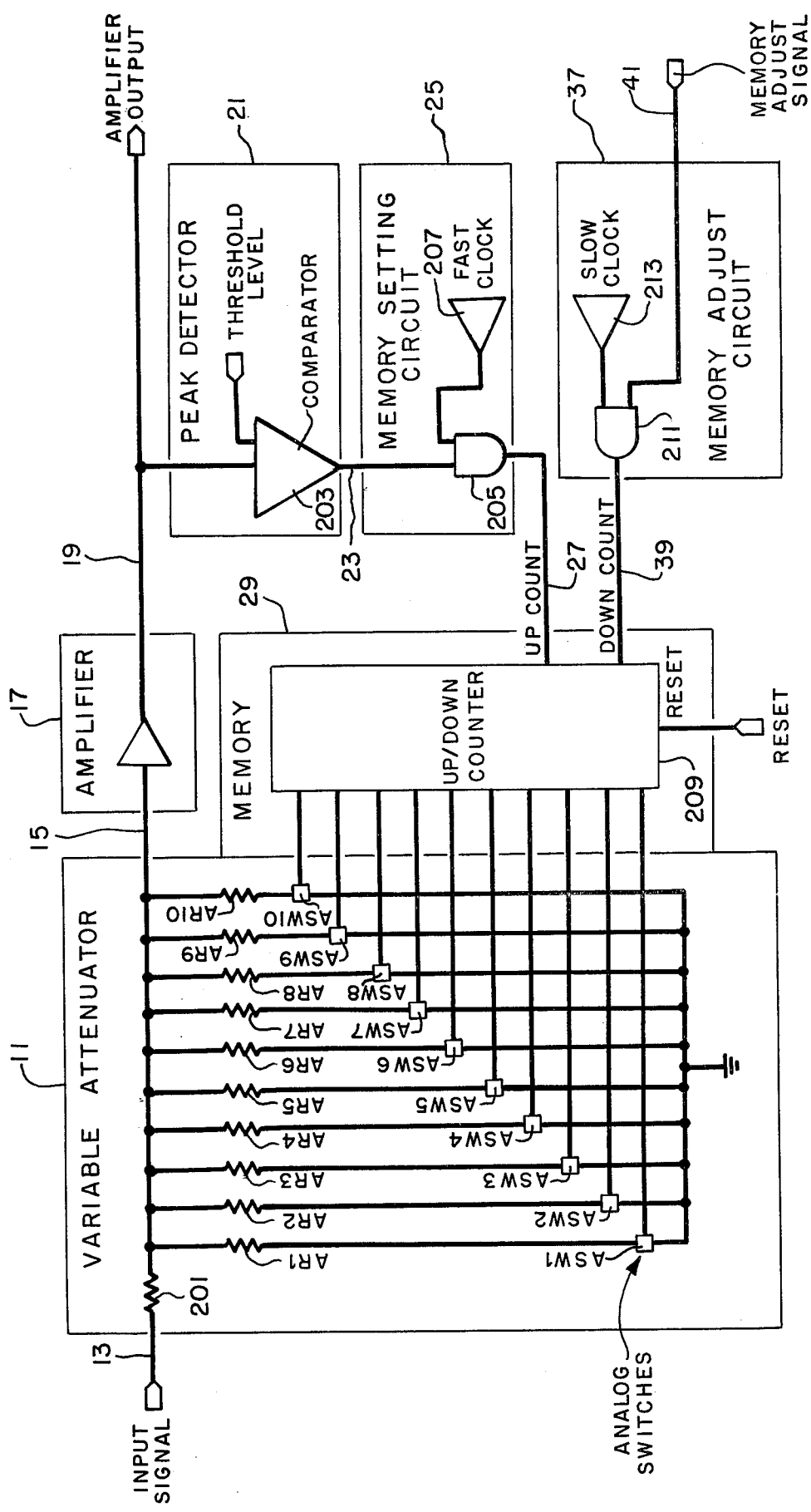
FIG. 4 is a detailed circuit diagram of the automatic gain control amplifier embodied in digital form.

FIGS. 3 and 4 show detailed embodiments of the automatic gain control amplifier 10 described above with respect to FIG. 1. The same reference numerals will be used with respect to the block components shown in FIG. 1.

FIG. 3 discloses an analog version of the automatic gain control amplifier 10. The variable attenuator 11 includes a transistor 101 which accepts the gain control output at a terminal A which is coupled to the base of the transistor 101. The base of the transistor 101 is also coupled to ground through a resistor 103. The input to the automatic gain control amplifier is applied at the input line 13 which is coupled to the collector of the transistor 101 via an input resistor 103. The collector of the transistor 101 is also coupled via the attenuated output line 15 to the amplifier 17. Thus, it is readily understood that the signal transmitted to the amplifier 17 will be attenuated as a function of the conductivity of the transistor 101 which is controlled by the gain control output present at the terminal A.

The amplifier 17 includes an operational amplifier 107 which accepts the attenuated output at its positive input from the attenuated output line 15. The negative input of the operational amplifier 107 is coupled to ground through a series RC network including a capacitor 108 and a resistor 109. A feedback network including a capacitor 111 in parallel with a resistor 112 is coupled between the output and the negative input of the operational amplifier 107. The output of the automatic gain control amplifier 10 is obtained at the amplifier output line 19.

The peak detector 21 senses the automatic gain control amplifier output present at the amplifier output line 19 through a voltage divider network including resistors 113 and 115 which are serially connected between the output line 19 and a source of positive potential +V. A transistor 117 has its base connected to the junction between the resistors 113 and 115. The emitter of the transistor 117 is grounded and the collector of the transistor 117 is biased by a resistor 119 which is connected to a source of negative potential −V. Thus, the threshold amplifier output level above which the transistor 117 will conduct is a function of the values of the resistors 113 and 115. When the threshold level is exceeded, the transistor 117 will conduct; and its collector will be slightly negative with respect to ground. When the transistor 117 is non-conductive, its collector is at the potential of −V.

The collector of the transistor 117 is connected via the detector output line 23 to the memory setting circuit 25, which includes an N-channel FET 121 which accepts the detector output at its gate. The source of the FET 121 is grounded, and the drain of the FET 121 is coupled through a resistor 123 to the memory setting line 27. The FET 121 will conduct when the potential at its gate is at or near the potential at its source. Therefore, the FET 121 will conduct whenever the amplifier output signal on the output line 19 exceeds a threshold level determined by the resistors 113 and 115, which causes the transistor 117 to conduct.

The output of the memory setting circuit is applied to the memory 29 via the memory setting line 27 which is coupled to one side of a memory capacitor 125 and an N-channel FET 127. The source of the FET 127 is connected to the other side of the memory capacitor 125 which is grounded; and the drain of the FET 127 is biased at the junction between resistors 129 and 131 which are serially connected between the positive source +V and ground. An output transistor 133 has its base coupled to the drain of the FET 127. The emitter of the output transistor 133 is biased through a resistor 135 which is connected to the positive source +V; and its collector is used as an output junction A which is coupled to the terminal A at the base of the transistor 101 of the attenuator 11. A resistor 137 coupled between the collector of the transistor 133 and ground provides a collector output voltage which varies with the conductivity of the transistor 133.

The operation of the memory 29 can be best understood by initially discussing the reset circuit 33 and the memory adjust circuit 37. The reset circuit 33 includes an N-channel FET 139 which accepts a reset signal at its gate. The drain of the FET 139 is coupled to the memory capacitor 125 via a resistor 141 and the reset line 35. The source of the FET 139 is coupled to a source of adjustable voltage 143. The voltage source includes a resistor 145 coupled to the source of negative potential −V and a variable resistor 147 coupled between the resistor 145 and ground. The source of the FET 139 is connected to the variable resistance arm of the variable resistor 147. A zener diode 149 is coupled across the variable resistor 147 to a constant voltage with respect to ground across the variable resistor 147.

The memory adjust circuit 37 includes an N-channel FET 151 which has its gate connected to the memory adjust actuation line 41. The drain of the FET 151 is coupled to the memory capacitor 125 via a resistor 153, and the source of the FET 151 is coupled to the variable resistance arm of the variable resistor 147.

The operation of the memory 29 is as follows. Application of a positive or near-ground level reset signal to the gate of the FET 139 causes the FET 139 to conduct, which places a pre-determined negative potential on the non-grounded end of the memory capacitor 125. The negative potential on the capacitor 125 is determined by the variable resistor 147. When the memory capacitor 125 is in its most negative state, the FET 125 is non-conductive; and the transistor 133 is off. Therefore, no signal is applied to the base of the transistor 101 in the attenuator 11; and no attenuation occurs. If the peak detector 21 senses that the amplifier output exceeds a predetermined threshold, the transistor 117 conducts and the potential applied to the FET 121 is close to ground level. The FET 121 will therefore conduct and the memory capacitor 125 will become more positive while always remaining at a potential below ground. As the potential across the memory capacitor 125 becomes less negative, the FET 127 will conduct as a function of the potential across the memory capacitor 125. The transistor 133 will, in turn, also become conductive as a function of the conductivity of the FET 127. Since the output of the transistor 133 is coupled to the base of the transistor 101, the transistor 101 will conduct as a function of the output of the transistor 133.

Therefore, it should be readily understood that the input signal applied to the input line 13 will be continuously attenuated as long as the amplifier output exceeds a predetermined threshold level. When the amplifier output level does not exceed the threshold level, the potential across the memory capacitor 125 will remain substantially fixed in the absence of any current from the reset circuit 33 and the memory adjust circuit 37 since the gate current of the FET 127 is negligible. Under such a condition the respective conductive or non-conductive states of the FET 127 and the transistors 133 and 101 remain substantially non-varying. Therefore, the attenuation of the attenuator 11 will remain at a reasonably fixed level.

The function of the memory adjust circuit 37 is to make the potential across the memory capacitor 125 more negative in response to signals on the memory adjust line actuation 41. Thus, a positive or near ground level signal applied to the gate of the FET 151 will cause it to conduct. The maximum negative potential which may be placed upon the memory capacitor 125 is determined by the variable resistor 147. Preferably, the resistor 141 should be considerably less than the value of the resistor 153 so that the reset circuit 33 will operate faster to set the memory capacitor to the selected maximum negative value. The actual value will of course depend upon the desired use of the disclosed automatic gain control amplifier 10. When the FET 151 is conductive, the potential across the memory capacitor is made more negative, thereby reducing the conductivity of the FET 127. It therefore is clear that this ultimately reduces the attenuation of the attenuator 11.

Briefly, the attenuation of the attenuator 11 is controlled by the potential across the memory capacitor 125. Therefore, the gain between the input signal at the input line 13 and the amplifier output is controlled by the potential across the memory capacitor 125. The potential across the memory capacitor 125 is determined by the memory setting circuit 25, the reset circuit 33, or the memory adjust circuit 37, and remain substantially fixed unless changed by these circuits.

FIG. 4 shows a detailed schematic of a digital embodiment of the automatic gain control amplifier 10 described with respect to FIG. 1. An input signal is applied to the input line 13 which is coupled through an input resistor 201 to a plurality of attenuator resistors AR1–AR10. The junction between the input resistor 201 and the resistors AR1–AR10 is coupled to the amplifier 19 via the attenuator output line 15. The resistors AR1–AR10 are connected to respective selectively actuable analog switches ASW1–ASW10, which are also connected to ground. The analog switches selectively connect the resistors AR1–AR10 to ground under the control of the memory, as will be discussed in greater detail below.

The amplifier 19 may be an appropriately biased operational amplifier as disclosed above with respect to FIG. 3.

The amplifier output on output line 19 is connected to the peak detector 21 which includes a comparator 203. The comparator 203 accepts the amplifier output signal at one input, and a threshold voltage level at the other input. The comparator 203 produces an output signal on the detector output line 23 when the amplifier output level exceeds the threshold voltage level.

The memory setting circuit 25 includes a dual input AND-gate 205 which accepts the output of the comparator 203 as one input. The other input of the AND-gate 205 receives clock pulses from a Fast Clock 207. Thus, the AND-gate will generate output pulses on the memory setting line 27 whenever an output from the comparator 203 is present.

The memory 29 includes a binary up-down counter 209 which accepts the output of the AND-gate 205 at its up-count input. Thus, the presence of pulses on the memory setting line 27 will cause the counter 209 to increment. The output bits of the binary counter 209 are respectively connected to the analog switches ASW1–ASW10. The presence of an output on any of the output bits of the counter 209 will cause the corresponding analog switches to couple the corresponding attenuator resistors to ground. The values of the attenuator resistors AR1–AR10 should be chosen such that the attenuation provided will be a function of the value of the binary output of the counter 209. For example, AR1 can be twice the value of AR2, which in turn is twice the value of AR3, and so forth. The counter 209 further includes a RESET input which accepts an appropriate reset signal to set the output of the counter to zero, thereby preventing any attenuation.

The memory adjust circuit 37 includes a dual input AND-gate 211 which accepts as one input a memory adjust signal via the memory adjust actuation line 41. The other input to the AND-gate received clock pulses from a Slow Clock 213. Thus, the presence of a memory adjust signal on the line 41 will cause the AND-gate 211 to produce output pulses. These output pulses are applied to the down count input of the counter 209 via the memory adjust line 39, which causes the counter 209 to decrement. Reducing the binary output value of the counter 209 in turn decreases the attenuation of the variable attenuator 11.

From the foregoing description of FIG. 4, it is readily seen that attenuation is increased in response to an amplifier output which exceeds a threshold level; and attenuation is decreased in response to the memory adjust signal which, for example, can be generated by the voice detection circuit described with respect to FIG. 2.

Although the foregoing has been a disclosure of specific embodiments of the inventions, it will be obvious to those skilled in the art that various changes and modifications can be made without departing from the scope of the invention as defined by the following claims.

What is claimed is:

1. An automatic gain control amplifier comprising:
   controllable means for accepting an input signal and for amplifying said input signal to produce an amplified output signal, said controllable means having a controllable gain;
   detection means responsive to said amplified output signal for producing a memory setting signal when said amplified output signal exceeds a predetermined threshold level;
   control means responsive to information derived from said amplified output for producing a memory control signal; and
   memory means responsive to said memory setting signal and said memory control signal for producing a gain control signal which varies as a function of both said memory setting signal and said memory control signal, said gain control signal cooperating with said amplifying means to decrease the gain of said amplifying means in response to said memory setting signal and to increase the gain of said amplifying means in response to said memory control signal.

2. The automatic gain control amplifier of claim 1 wherein said controllable means includes:
   a variable attenuator for accepting the input signal and for varying the attenuation of the input signal as a function of said gain control signal; and
   an amplifier having an input for accepting the attenuated signal for providing the amplified output signal.

3. The automatic gain control amplifier of claim 2 wherein said detection means comprises:
   a peak detector for providing a detection output when the amplified output signal exceeds a predetermined threshold level; and
   means for providing said memory setting signal in response to said detection output.

4. The automatic gain control amplifier of claim 3 wherein said memory setting signal providing means comprises first current switching means for generating a first output current in response to said detection output; and wherein said memory control means comprises second current switching means for generating a second current in response to the information derived from said amplified output signal; said first and second current outputs being applied to said memory means.

5. The automatic gain control amplifier of claim 4 wherein said memory means comprises a charge storage circuit for providing said gain control signal, said gain control signal varying in response to said first and second output currents and cooperating with said variable attenuator to tend to continually increase the attenuation of said variable attenuator during the presence of said first output current and to tend to continuously decrease the attenuation of said variable attenuator during the presence of said second output current, said gain control signal remaining substantially fixed in the absence of both said first and second output currents.

6. The automatic gain control amplifier of claim 5 wherein said variable attenuator comprises variable impedance means controlled by said gain control signal from said charge storage circuit and being coupled between the input of said amplifier and ground.

7. The automatic gain control amplifier of claim 3 wherein said memory setting signal providing means comprises first pulse generating means for providing first output pulses in response to said detection output; and wherein said memory control means comprises second pulse generating means for providing second output pulses in response to the information derived from said amplified output signal; said first and second output pulses being applied to said memory means.

8. The automatic gain control amplifier of claim 7 wherein said memory means comprises digital up/down counter means for generating a binary valued output in response to said first and second output pulses, said binary value increasing in response to said first output pulses and decreasing in response to said second output pulses; said digital up/down counter means cooperating with said variable attenuator to increase attenuation with an increase in the binary valued output of said digital up/down counter means and to decrease attenuation with a decrease in the binary valued output of said digital up/down counter means.

9. The automatic gain control amplifier of claim 8 wherein said variable attenuator comprises:
a plurality of resistors, each having its respective first end coupled to the input of said amplifier; and
switching means coupled to the second ends of said resistors for selectively coupling predetermined ones of said resistors to ground as a function of the binary value of the up/down counter output.

10. In combination with voice detection circuitry which provides a voice present output signal, the improvement comprising:
controllable means for accepting an input signal having components representative of voice and for amplifying said input signal to produce an amplifier output signal, said controllable means having a controllable gain;
detection means responsive to said amplified output signal for producing a memory setting signal when said amplified output signal exceeds a predetermined threshold level;
control means responsive to information derived from said amplified output for producing a memory control signal; and
memory means responsive to said memory setting signal and said memory control signal for producing a gain control signal which varies as a function of both said memory setting signal and said memory control signal, said gain control signal cooperating with said amplifying means to decrease the gain of said amplifying means in response to said memory setting signal and to increase the gain of said amplifying means in response to said memory control signal.

11. The combination of claim 10 wherein said controllable means includes:
a variable attenuator for accepting the input signal and for varying the attenuation of the input signal as a function of said gain control signal; and
an amplifier having an input for accepting the attenuated signal for providing the amplified output signal.

12. The combination of claim 11 wherein said detection means comprises:
a peak detector for providing a detection output when the amplified output signal exceeds a predetermined threshold level; and
means for providing said memory setting signal in response to said detection output.

13. The combination of claim 12 wherein said memory setting signal providing means comprises first current switching means for generating first output current in response to said detection output; and wherein said memory control means comprises second current switching means for generating a second current in response to the information derived from said amplified output signal; said first and second current output being applied to said memory means.

14. The combination of claim 13 wherein said memory means comprises a charge storage circuit for providing said gain control signal, said gain control signal varying in response to said first and second output currents and cooperating with said variable attenuator to tend to continually increase the attenuation of said variable attenuator during the presence of said first output current and to tend to continuously decrease the attenuation of said variable attenuator during the presence of said second output current, said gain control signal remaining substantially fixed in the absence of both said first and second output currents.

15. The combination of claim 14 wherein said variable attenuator comprises variable impedance means controlled by said gain control signal from said charge storage circuit and being coupled between the input of said amplifier and ground.

16. The combination of claim 12 wherein said memory setting signal providing means comprises first pulse generating means for providing first output pulses in response to said detection output; and wherein said memory control means comprises second pulse generating means for providing second output pulse in response to the information derived from said amplified output signal; said first and second output pulses being applied to said memory means.

17. The combination of claim 16 wherein said memory means comprises digital up/down counter means for generating a binary valued output in response to said first and second output pulses, said binary value increasing in response to said first output pulses and decreasing in response to said second output pulses; said digital up/down counter means cooperating with said variable attenuator to increase attenuation with an increase in the binary valued output of said digital up/down counter means and to decrease attenuation with a decrease in the binary valued output of said digital up/down counter means.

18. The combination of claim 17 wherein said variable attenuator comprises:
a plurality of resistors, each having its respective first end coupled to the input of said amplifier; and
switching means coupled to the second ends of said resistors for selectively coupling predetermined ones of said resistors to ground as a function of the binary value of the digital up/down counter means output.

19. A voice detection system comprising;
controllable means for accepting an input signal having components representative of voice and for amplifying said input signal to produce an amplifier output signal, said controllable means having a controllable gain;
detection means responsive to said amplified output signal for producing a memory setting signal when said amplified output signal exceeds a predetermined threshold level;
voice detection means responsive to said amplifier output signal for providing an output signal when voice components are present in said amplifier output signal;

control means responsive to said voice detection means output for producing a memory control signal when said voice detection means output is present; and memory means responsive to said memory setting signal and said memory control signal for producing a gain control signal which varies as a function of both said memory setting signal and said memory control signal, said gain control signal cooperating with said amplifying means to decrease the gain of said amplifying means in response to said memory setting signal and to increase the gain of said amplifying means in response to said memory control signal.

20. The voice detection system of claim 19 wherein said controllable means includes:

a variable attenuator for accepting the input signal and for varying the attenuation of the input signal as a function of said gain control signal; and an amplifier having an input for accepting the attenuated signal for providing the amplified output signal.

21. The voice detection system of claim 20 wherein said detection menas comprises:

a peak detector for providing a detection output when the amplified output signal exceeds a predetermined threshold level; and means for providing said memory setting signal in response to said detection output.

22. The voice detection system of claim 21 wherein said memory setting signal providing means comprises first current switching means for generating a first output current in response to said detection output; and wherein said memory control means comprises second current switching means for generating a second current in response to said voice detection means output; said first and second current output being applied to said memory means.

23. The voice detection system of claim 22 wherein said memory means comprises a charge storage circuit for providing said gain control signal, said gain control signal varying in response to said first and second output currents cooperating with said variable attenuator to tend to continually increase the attenuation of said variable attenuator during the presence of said first output current and to tend to continuously decrease the attenuation of said variable attenuator during the presence of said second output current, said gain control signal remaining substantially fixed in the absence of both said first and second output currents.

24. The voice detection system of claim 23 wherein said variable attenuator comprises variable impedance means controlled by said gain control signal from said charge storage circuit and being coupled between the input of said amplifier and ground.

25. The voice detection system of claim 21 wherein said memory setting signal providing means comprises first pulse generating means for providing first output pulses in response to said detection output; and wherein said memory control means comprises second pulse generating means for providing second output pulses in response to the information derived from said amplified output signal; said first and second output pulses being applied to said memory means.

26. The voice detection system of claim 25 wherein said memory means comprises digital up/down counter means for generating a binary valued output in response to said first and second output pulses, said binary value increasing in response to said first output pulses and decreasing in response to said second output pulses; said digital up/down counter means cooperating with said variable attenuator to increase attenuation with an increase in the binary valued output of said digital up/down counter means and to decrease attenuation with a decrease in the binary valued output of said digital up/down counter means.

27. The voice detection system of claim 26 wherein said variable attenuator comprises:

a plurality of resistors, each having its respective first end coupled to the input of said amplifier; and switching means coupled to the second ends of said resistors for selectively coupling predetermined ones of said resistors to ground as a function of the binary value of the digital up/down counter means output.

* * * * *